(12) United States Patent
Takeoka

(10) Patent No.: US 7,620,086 B2
(45) Date of Patent: Nov. 17, 2009

(54) SEMICONDUCTOR LASER AND ELECTRONIC DEVICE

(75) Inventor: Tadashi Takeoka, Hiroshima (JP)

(73) Assignee: Sharp Kabushiki Kaisha, Osaka (JP)

( * ) Notice: Subject to any disclaimer, the term of this patent is extended or adjusted under 35 U.S.C. 154(b) by 39 days.

(21) Appl. No.: 11/872,195

(22) Filed: Oct. 15, 2007

(65) Prior Publication Data
US 2008/0095205 A1    Apr. 24, 2008

(30) Foreign Application Priority Data
Oct. 19, 2006   (JP) .............................. 2006-285444

(51) Int. Cl.
*H01S 5/00* (2006.01)
*H01S 3/08* (2006.01)
(52) U.S. Cl. .................... 372/46.015; 372/92
(58) Field of Classification Search ........... 372/46.015, 372/92
See application file for complete search history.

(56) References Cited

U.S. PATENT DOCUMENTS
2002/0037022 A1*   3/2002   Fukagai ..................... 372/46

FOREIGN PATENT DOCUMENTS
| JP | 2003-124569 | 4/2003 |
| JP | 2005-101440 | 4/2005 |
| JP | 2006-128405 | 5/2006 |

* cited by examiner

*Primary Examiner*—Armando Rodriguez
(74) *Attorney, Agent, or Firm*—Nixon & Vanderhye P.C

(57) ABSTRACT

In one embodiment of the invention, in a semiconductor laser in which a first conductivity type lower cladding layer, an active layer that includes a quantum well layer, and a second conductivity type upper cladding layer are formed in this order on a semiconductor substrate, a dopant concentration of the lower cladding layer is not more than $4.0 \times 10^{17}/cm^3$, and a resonator length is not less than 1500 μm.

20 Claims, 11 Drawing Sheets

FIG.8

| Sample | Configuration | | | Properties | | | | | | Evaluation |
|---|---|---|---|---|---|---|---|---|---|---|
| | resonator length L (μm) | lower cladding layer dopant concentration Nc (/cm³) | | differential efficiency η (W/A) | threshold current Ith (mA) | light output Pop (mW) | operating current Iop (mA) | operating current density Jop (kA/cm²) | longevity LT (h) | |
| Example 1 | 1500 | (first lower cladding layer) $4 \times 10^{17}$ | (second lower cladding layer) $4 \times 10^{17}$ | 1.05 | 63 | 300 | 500 | 18 | 5000 | long life even in state of adequate light output; practical use possible |
| Example 2 | 1800 | (first lower cladding layer) $2 \times 10^{17}$ | (second lower cladding layer) $2 \times 10^{17}$ | 1.15 | 62 | 400 | 600 | 18 | 5000 | higher output than Example 1 is possible |
| Comparison Example 1 | 1300 | $2 \times 10^{18}$ | | 0.83 | 73 | 180 | 420 | 18 | 5000 | low light output; not applicable to optical drive |
| Comparison Example 2 | 2000 | $2 \times 10^{18}$ | | 0.65 | 95 | 300 | 630 | 27 | ≤50 | short life; practical use not possible |
| | | | | | | 300 | 800 | 22 | 800 | short life; practical use not possible |

(75°C)

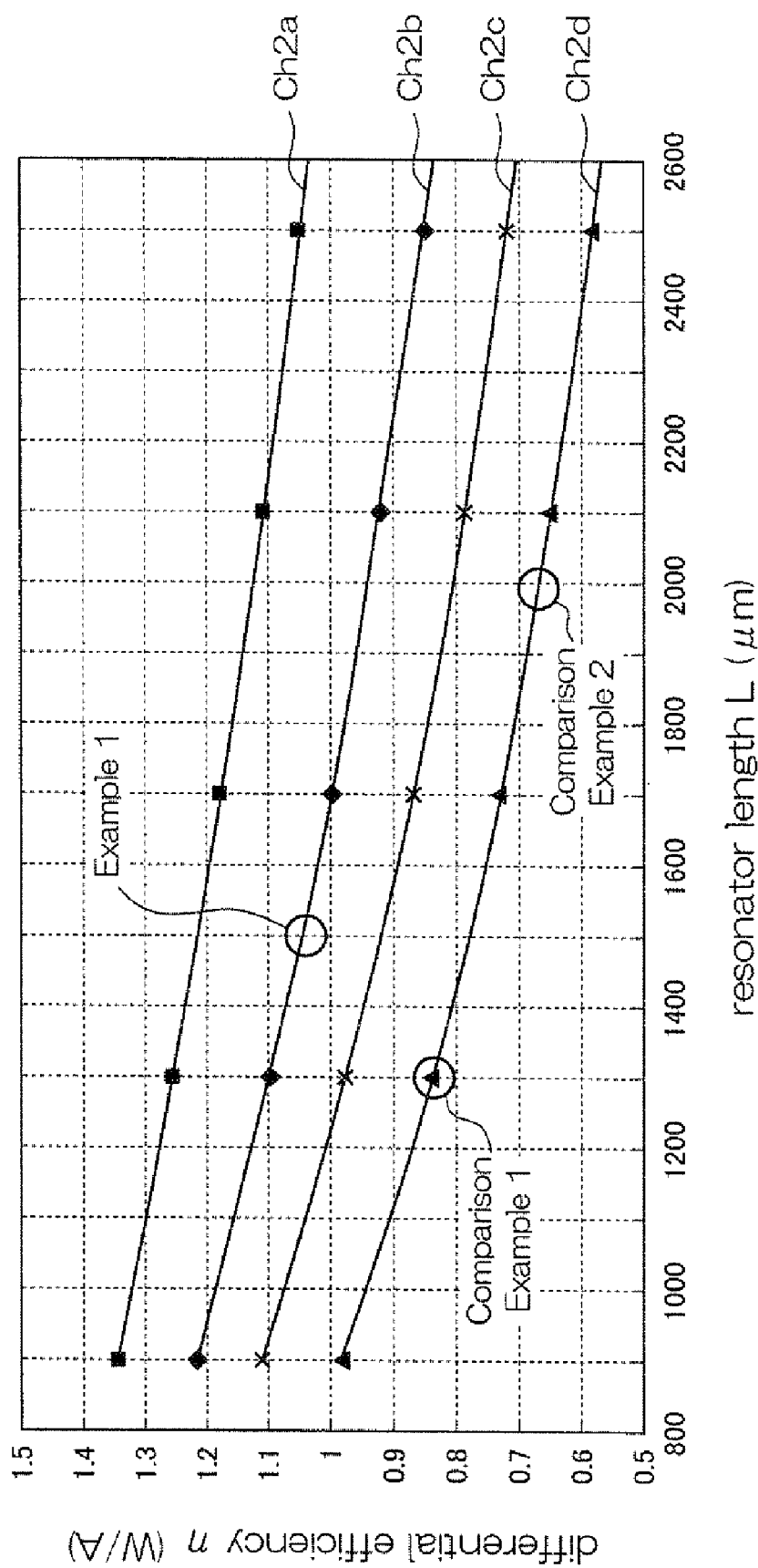

SEMICONDUCTOR LASER AND ELECTRONIC DEVICE

This application claims priority under 35 U.S.C. § 119(a) on Japanese Patent Application No. 2006-285444 filed in Japan on Oct. 19, 2006, the entire contents of which are hereby incorporated by reference.

BACKGROUND

1. Field

The technical field of this disclosure relates to a semiconductor laser in which a lower cladding layer, an active layer and an upper cladding layer are formed in this order on a semiconductor substrate, and an electronic device in which such a semiconductor laser is applied.

2. Description of the Related Art

Semiconductor lasers are proposed in which a lower cladding layer, an active layer, and an upper cladding layer are formed in this order on a semiconductor substrate. Such semiconductor lasers are applied in electronic devices that perform recording by writing optical data to an optical disk (an optical disk for writing).

Acceleration in the write speed of optical disks has been accompanied by demands for increased optical output relative to conventional semiconductor lasers. Also, there is a trend in recent years towards practical use of optical disks that have two recording layers in order to enlarge the capacity of optical disks, and as a result there are further demands for increased output of semiconductor lasers.

However, increased output of semiconductor lasers is accompanied by the following sorts of problems. The first problem is that an increase in optical output from a light-exiting end face of the semiconductor laser is accompanied by deterioration of the light-exiting end face. The second problem is a deterioration in properties when power is turned on, due to driving current (operating current) that is increased in order to increase the optical output, i.e., there is a reduction in reliability. It is necessary to address these problems in order to apply increased optical output to an optical disk.

As technology that prevents deterioration of a light-exiting end face due to increased optical output, it is known to be effective to form a region in the light-exiting end face where a band gap is enlarged, i.e., a so-called window region (for example, see JP 2003-124569A).

However, the deterioration phenomenon that accompanies increased driving current (operating current) occurs even when end face deterioration has been prevented by forming a window region. That is, even in a state in which optical deterioration does not occur at the end face, increased driving current causes deterioration in the increase in the driving current and deterioration in the optical output, due to crystal deterioration inside the semiconductor laser. Also, it is has been confirmed through testing that under a condition that deterioration does not occur at the end face, operating current density when driving has an effect on reliability.

Accordingly, in order to insure adequate reliability even when optical output has been increased, it is necessary that the operating current density is not increased. In order to prevent reduced reliability due to increased driving current when optical output has been increased, it is effective to increase the length of a resonator. That is, when increasing the driving current of a semiconductor laser, by increasing the length of a resonator it is possible to reduce a current value per unit area, i.e., it is possible to reduce the operating current density.

However, in the semiconductor laser, when the resonator is lengthened, a differential efficiency η (slope of optical output properties to operating current: W/A) decreases. Accordingly, with the differential efficiency η remaining low, it is necessary to increase the operating current in order to realize a predetermined optical output, and as a result there is the problem that the operating current density cannot be adequately reduced.

Also, semiconductor lasers in which an active layer is sandwiched by upper and lower cladding layers are disclosed in JP 2005-101440A and JP 2006-128405A.

The inventors of the present application, in the course of performing various testing, found that as a measure for improving the differential efficiency η, it is effective to reduce the concentration (dopant concentration, or carrier concentration) of a dopant introduced to the lower cladding layer as an impurity. That is, when the operating current density is reduced by increasing the length of the resonator, by reducing the dopant concentration of a lower cladding layer configured for example with n-type conductivity as a first conductivity type, a decrease in the differential efficiency η is prevented, so an increase in the operating current density is suppressed, and thus it is possible to prevent a decrease in reliability.

Also, because the reduction in the dopant concentration of the lower cladding layer increases resistance, it is necessary to increase operating voltage. For example, in an optical pickup (an optical drive such as an optical disk apparatus) that uses a semiconductor laser, a laser driver IC is used in order to drive the semiconductor laser. In the laser driver IC, there is a maximum current rating in consideration of IC heat loss and the like. Also, there is a rating for a maximum rated voltage of laser driving that is determined from the power source voltage specification inside the optical drive and a voltage drop inside the laser driver IC. Accordingly, in order to apply a semiconductor laser in an optical drive (laser driver IC), it is necessary to not exceed the maximum rated current and the maximum rated voltage of the laser driver IC, and it is necessary to suppress an increase in the operating voltage of the semiconductor laser.

SUMMARY

In a non-limiting aspect, is provided a semiconductor laser in which it is possible to insure adequate light output and longevity suitable to an application, and in which it is possible to prevent a rise in operating voltage even when a resonator length has been increased and a dopant concentration of a lower cladding layer has been decreased in order to insure high reliability (longevity) in an operating state of high light output.

In another non-limiting aspect, electronic device capable of writing optical data with high reliability is proviced.

A non-limiting example semiconductor laser includes a first conductivity type lower cladding layer, an active layer that includes a quantum well layer, and a second conductivity type upper cladding layer are formed in this order on a semiconductor substrate, in which a dopant concentration of the lower cladding layer is not more than $4.0 \times 10^{17}/cm^3$, and a resonator length is not less than 1500 μm.

With this configuration, a reduction in differential efficiency due to increasing the length of the resonator is prevented, so it is possible to realize adequate differential efficiency, and thus it is possible to insure the longevity necessary for practical use by reducing the operating current density when a desired light output has been set.

Another non-limiting example semiconductor laser includes a first conductivity type lower cladding layer, an active layer that includes a quantum well layer and a second conductivity type upper cladding layer are formed in this order on a semiconductor substrate, in which a dopant concentration of the lower cladding layer is not more than $2.0 \times 10^{17}/cm^3$, and a resonator length is not less than 1800 μm.

With this configuration, a reduction in differential efficiency due to increasing the length of the resonator is prevented, so it is possible to realize adequate differential efficiency, and thus it is possible to insure the longevity necessary for practical use by reducing the operating current density when a desired high light output has been set.

In this manner, the dopant concentration of the lower cladding layer and the resonator length are demarcated, so an effect is obtained that it is possible to insure adequate light output and longevity suitable to an application.

A configuration may be adopted in which the lower cladding layer includes a first lower cladding layer on the semiconductor substrate side and a second lower cladding layer on the active layer side, wherein the dopant concentration in a semiconductor side region that is located on the semiconductor substrate side of the first lower cladding layer is set higher than the dopant concentration in an active layer side region that is located on the active layer side of the first lower cladding layer.

Also, a configuration may be adopted in which the lower cladding layer includes a first lower cladding layer on the semiconductor substrate side and a second lower cladding layer on the active layer side, the first lower cladding layer including a substrate side region located on the semiconductor substrate side and where light that is waveguided with the active layer is not distributed, and an active layer side region located on the active layer side and where light that is waveguided with the active layer is distributed, and the dopant concentration in the substrate side region is set higher than the dopant concentration in the active layer side region.

Alternatively, a configuration may be adopted in which the lower cladding layer includes a first lower cladding layer on the semiconductor substrate side and a second lower cladding layer on the active layer side, the first lower cladding layer including a substrate side region located on the semiconductor substrate side and where light that is waveguided with the active layer is not distributed, and an active layer side region located on the active layer side and where light that is waveguided with the active layer is distributed, and the dopant concentration in the substrate side region is gradually increased relative to the dopant concentration in the active layer side region, beginning from the active layer side.

With the above configuration, it is possible to realize a semiconductor laser having high differential efficiency in which there is no increase in the operating voltage.

In other words, effects are obtained that it is possible to prevent a rise in operating voltage even when resonator length has been increased and dopant concentration of the lower cladding layer has been decreased in order to insure high reliability (longevity) in an operating state of high light output, and it is possible to perform driving with an ordinary laser driver IC that has a low operating voltage.

The dopant concentration of the substrate side region is preferred to be not less than $4.0 \times 10^{17}/cm^3$.

With this configuration, a high differential efficiency is maintained, and an increase in element resistance is prevented, so it is possible to reliably realize high light output.

The thickness of the substrate side region is preferred to be not less than 30 nm and not more than 300 nm.

With the above configuration, it is possible to reliably realize a semiconductor laser having high differential efficiency in which there is no increase in the operating voltage.

A light-exiting end portion of the active layer can have a window structure.

With this configuration, it is possible to reliably prevent deterioration of a light-exiting end face.

The dopant can be silicon.

With this configuration, it is possible to easily and precisely control the dopant concentration, and so the lower cladding layer can be precisely formed.

An electronic device using the semiconductor laser according to the non-limiting embodiments can write optical data.

With this configuration, the electronic device is capable of writing optical data to an optical disk reliably over a long period of time.

BRIEF DESCRIPTION OF THE DRAWINGS

FIG. 8 is a properties comparison table that shows a comparison of configurations and properties of embodiments and comparison examples, based on the semiconductor laser shown in FIG. 1.

FIG. 9 is a correlation graph that shows the correlation between resonator length and differential efficiency in the semiconductor laser shown in FIG. 1, with respect to four parameters for the dopant concentration of a lower cladding layer.

DESCRIPTION OF THE PREFERRED EMBODIMENTS

Hereinafter, non-limiting embodiments of the present invention will be described with reference to the accompanying drawings.

Note that $(Al_xGa_{1-x})_yIn_{1-y}P$ ($0 \leq x \leq 1$, $0 \leq y \leq 1$) is abbreviated as AlGaInP, $Ga_zIn_{1-z}P$ ($0 \leq z \leq 1$) is abbreviated as GaInP, and $Al_rGa_{1-r}As$ ($0 \leq r \leq 1$) is abbreviated as AlGaAs. Also, by way of example, a description is given in which n-type conductivity is a first conductivity type and p-type conductivity is a second conductivity type, but opposite conductivity types are also possible.

Embodiment 1

Figure 1:
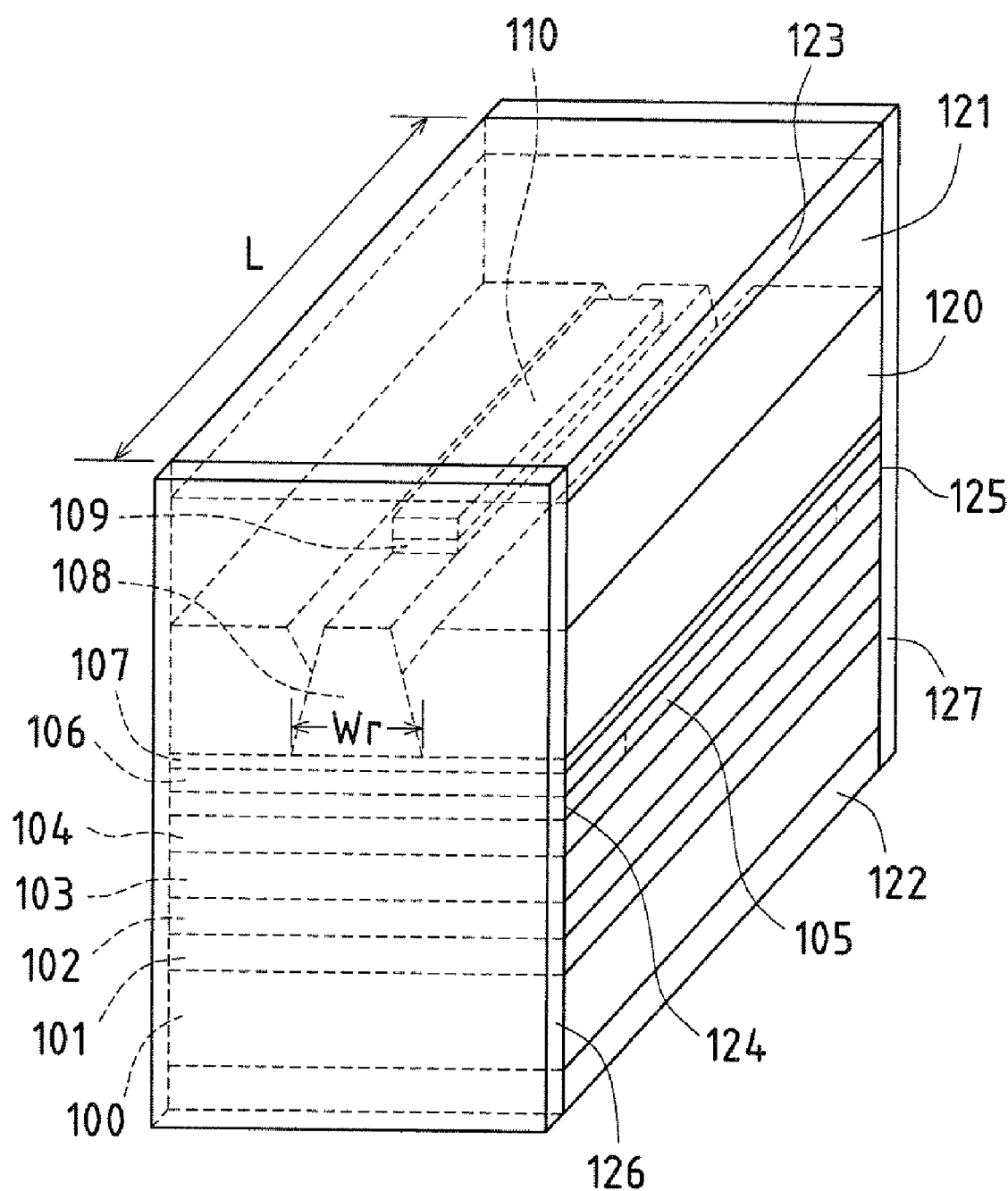
FIG. 1 is a perspective view that schematically shows an example structure of a semiconductor laser according to a non-limiting Embodiment 1.

FIG. 1 is a perspective view that schematically shows an example structure of a semiconductor laser according to Embodiment 1.

In the semiconductor laser according to the present embodiment, a buffer layer 101, a buffer layer 102, a first lower cladding layer 103, a second lower cladding layer 104, an active layer 105, a first upper cladding layer 106, and an etching stop layer 107 are layered in this order on a semiconductor substrate 100. Also, the first lower cladding layer 103 and the second lower cladding layer 104 may be referred to together as simply the lower cladding layer.

The semiconductor substrate 100 is constituted from n-type GaAs, the buffer layer 101 is constituted from n-type GaAs, the buffer layer 102 is constituted from n-type GaInP, the first lower cladding layer 103 is constituted from n-type $(Al_{0.65}Ga_{0.35})_{0.5}In_{0.5}P$ with a thickness of 2.0 µm, the second lower cladding layer 104 is constituted from n-type $(Al_{0.665}Ga_{0.335})_{0.5}In_{0.5}P$ with a thickness of 2.0 µm, the active layer 105 is constituted from an un-doped layer that includes a quantum well layer, the first upper cladding layer 106 is constituted from p-type $(Al_{0.68}Ga_{0.32})_{0.5}In_{0.5}P$ with a thickness of 0.1 µm, and the etching stop layer 107 is constituted from p-type GaInP.

Further, as a ridge stripe portion, a second upper cladding layer 108, a middle band gap layer 109, and a cap layer 110 are layered in this order on the etching stop layer 107. That is, the ridge stripe portion is configured with the second upper cladding layer 108, which is formed protruding ridge-like at part of the surface of the etching stop layer 107, and the middle band gap layer 109 and the cap layer 110 that are layered in order on the second upper cladding layer 108. Also, the first upper cladding layer 106 and the second upper cladding layer 108 may be referred to together as simply the upper cladding layer.

The second upper cladding layer 108 is constituted from p-type $Al_{0.68}Ga_{0.32})_{0.5}In_{0.5}P$ with a thickness of 1.5 µm, the middle band gap layer 109 is constituted from p-type GaInP with a thickness of 0.05 µm, and the cap layer 110 is constituted from p-type GaAs with a thickness of 0.5 µm. The width of the ridge stripe portion (ridge width Wr: width of the bottom face of the second upper cladding layer 108) is 1.8 µm.

A current blocking layer 120 is formed in a region on the etching stop layer 107 where the second upper cladding layer 108 is not formed, and a contact layer 121 and a p-side electrode 123 are formed in this order on the current blocking layer 120. An n-side electrode 122 is formed on the face of the semiconductor substrate 100 that is opposite to the face where the buffer layer 101 is formed. The current blocking layer 120 is constituted from n-type AlInP, and the contact layer 121 is constituted from p-type GaAs.

Also, a front face reflective film 126 and a rear face reflective film 127 are respectively formed on light-exiting end faces 124 and 125 formed at end portions in the lengthwise direction perpendicular to the surface of the n-type substrate 100. A resonator length L is delineated by the distance of the light-exiting end faces 124 and 125 from each other.

Also, in the semiconductor laser according to the present embodiment, silicon (Si) is used as an n-type dopant, and magnesium (Mg) is used as a p-type dopant, with the Mg having a concentration of $1.0 \times 10^{18}/cm^3$. By using Si as the n-type dopant, it is possible to easily and precisely control a dopant concentration Nc, and so the lower cladding layers can be precisely formed.

Figure 2:
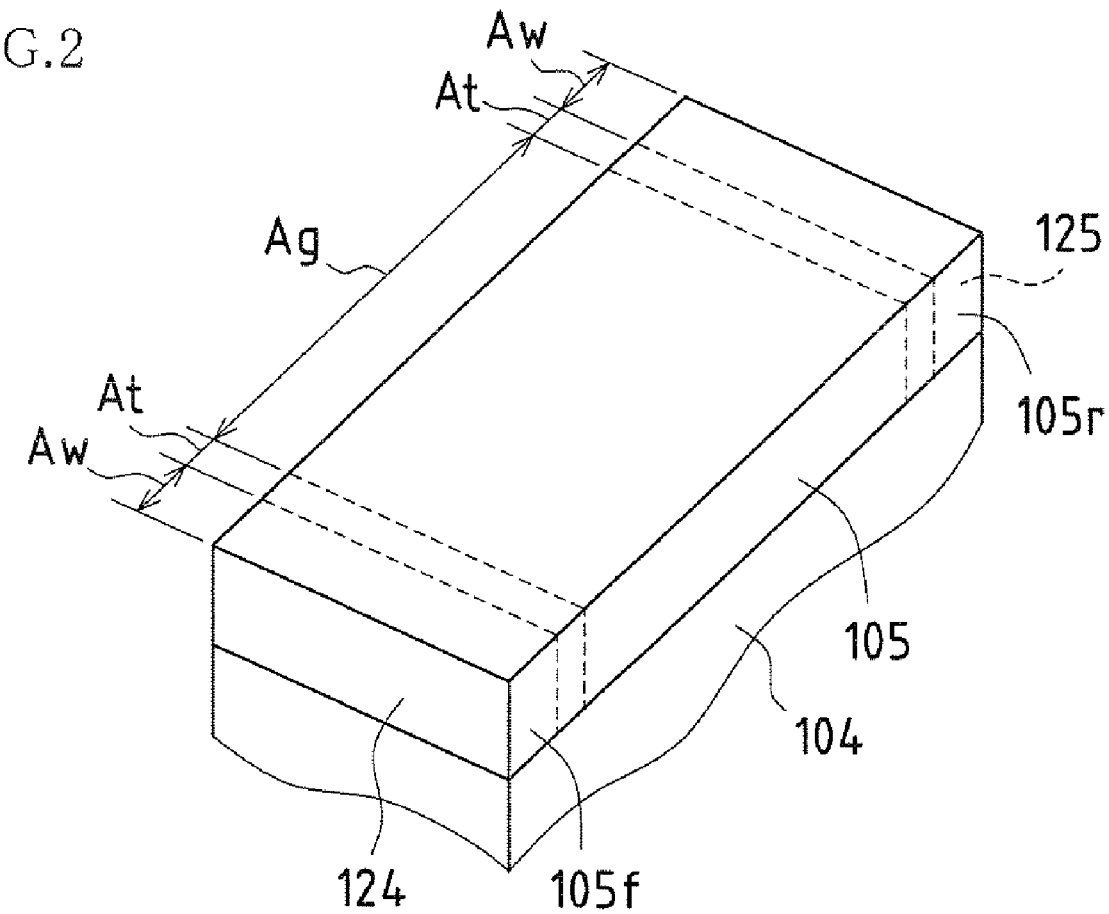
FIG. 2 is a perspective view that shows the arrangement relationship between a gain region and a window portion in an active layer of the semiconductor laser shown in FIG. 1.

FIG. 2 is a perspective view that shows the arrangement relationship between a gain region and a window portion in an active layer of the semiconductor laser shown in FIG. 1.

In the active layer 105 of the semiconductor laser according to the present embodiment, a region of fixed length from the light-exiting end faces 124 and 125 is converted to mixed crystal to form a window region Aw. An energy band gap of the active layer 105 in the window region Aw converted to mixed crystal is larger than an energy band gap of the active layer 105 in a gain region Ag, which is a region where light is amplified. Accordingly, because light from the semiconductor laser is not absorbed in the window region Aw, there is not deterioration at the light-exiting end faces 124 and 125 of the semiconductor laser due to light absorption.

The window region Aw is formed by sequentially layering each layer from the buffer layer 101 to the cap layer 110 on the surface of the semiconductor substrate 100, forming a ZnO film (not shown) with a thickness of 35 nm and a $SiO_2$ film (not shown) with a thickness of 200 nm in this order at both ends (region corresponding to the window region Aw) of the upper face of the cap layer 110, and then performing heating treatment for 2 hours at 510° C. to disperse Zn.

The $SiO_2$ film is formed in order to prevent the Zn from evaporating to the outside. The ZnO film and the $SiO_2$ film are removed after the heating treatment. Also, when forming the window region Aw, a transition region At where there is a change in the spread of light intensity distribution is formed between the window region Aw and the gain region Ag. Also, both ends of the middle band gap layer 109 and the cap layer 110 (region of about 30 µm from the light-exiting end faces 124 and 125) are removed.

The window region Aw corresponding to the light-exiting end face 124 that is the front face of the semiconductor laser is formed in a light-exiting end portion 105f of the active layer 105, and the window region Aw corresponding to the light-exiting end face 125 that is the rear face of the semiconductor laser is formed in a light-exiting end portion 105r of the active layer 105. That is, because the light-exiting end portions 105f and 105r have a window structure (window region Aw), it is possible to reliably prevent deterioration of the light-exiting end faces 124 and 125.

Figure 3:
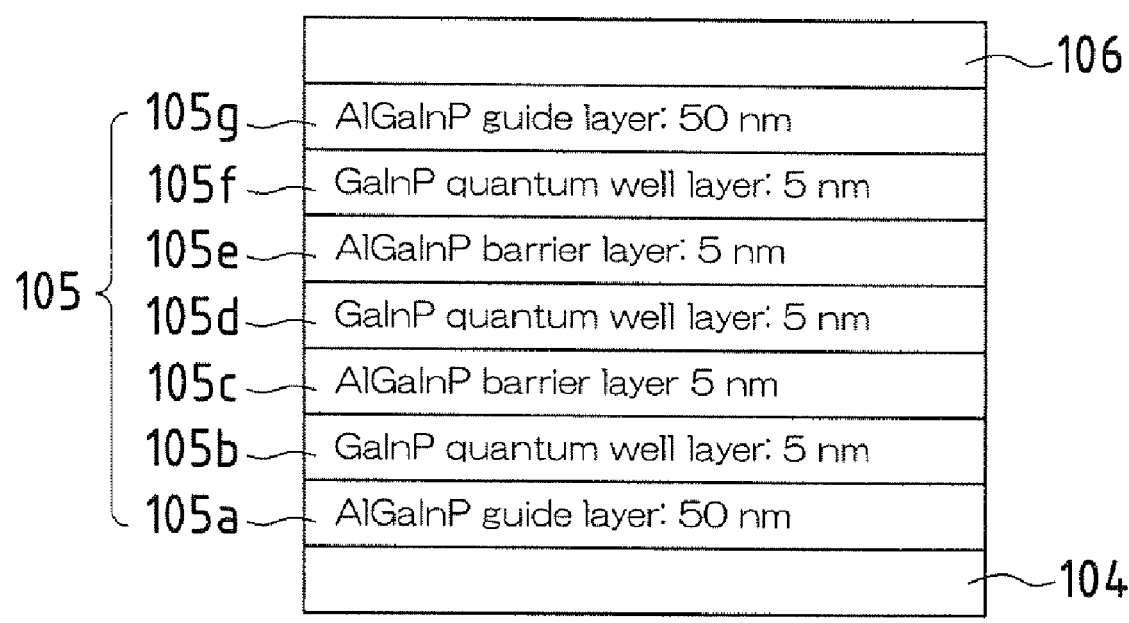
FIG. 3 is a side view that conceptually shows an example layer structure of the active layer of the semiconductor laser shown in FIG. 1.

FIG. 3 is a side view that conceptually shows an example layer structure of the active layer of the semiconductor laser shown in FIG. 1.

The active layer 105 is configured with a $(Al_{0.56}Ga_{0.44})_{0.5}In_{0.5}P$ guide layer 105a with a thickness of 50 nm, a $Ga_{0.5}In_{0.5}P$ quantum well layer 105b with a thickness of 5 nm, a $(Al_{0.56}Ga_{0.44})_{0.5}In_{0.5}P$ barrier layer 105c with a thickness of 5 nm, a $Ga_{0.5}In_{0.5}P$ quantum well layer 105d with a thickness of 5 nm, a $(Al_{0.56}Ga_{0.44})_{0.5}In_{0.5}P$ barrier layer 105e with a thickness of 5 nm, a $Ga_{0.5}In_{0.5}P$ quantum well layer 105f with a thickness of 5 nm, and a $(Al_{0.56}Ga_{0.44})_{0.5}In_{0.5}P$ guide layer 105g with a thickness of 50 nm, which are layered in order from the second lower cladding layer 104 to the first upper cladding layer 106.

Figure 4:
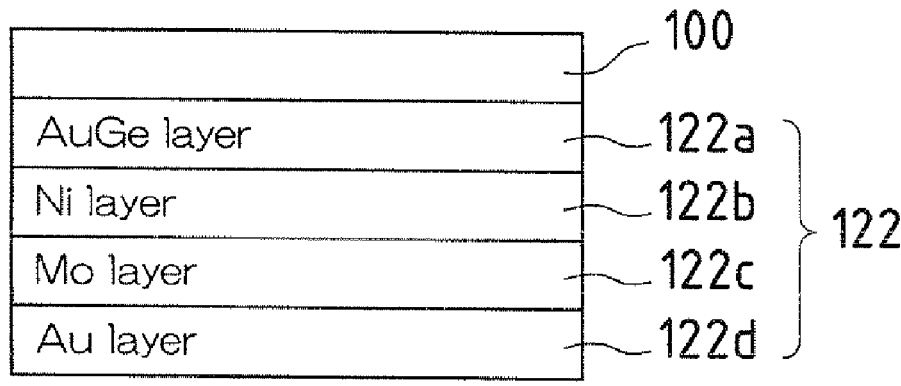
FIG. 4 is a side view that conceptually shows an example layer structure of an n-side electrode of the semiconductor laser shown in FIG. 1.
Figure 5:
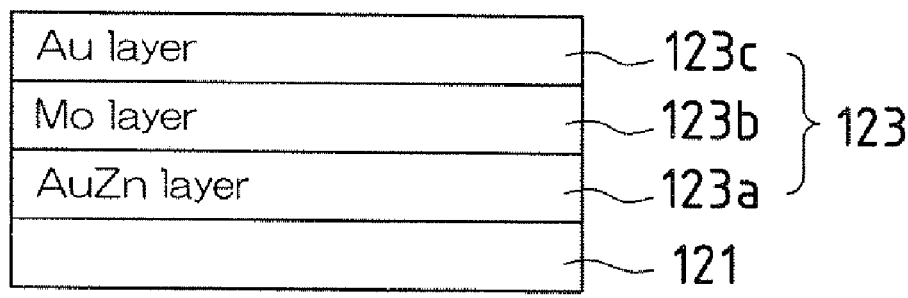
FIG. 5 is a side view that conceptually shows an example layer structure of a p-side electrode of the semiconductor laser shown in FIG. 1.

FIG. 4 is a side view that conceptually shows an example layer structure of an n-side electrode of the semiconductor laser shown in FIG. 1. FIG. 5 is a side view that conceptually shows an example layer structure of a p-side electrode of the semiconductor laser shown in FIG. 1.

The n-side electrode 122 is formed by layering an AuGe layer 122a, an Ni layer 122b, a Mo layer 122c, and an Au layer 122d on the semiconductor substrate 100, in this order. The p-side electrode is formed by layering an AuZn layer 123a, a Mo layer 123b, and an Au layer 123c on the contact layer 121, in this order.

Figure 6:
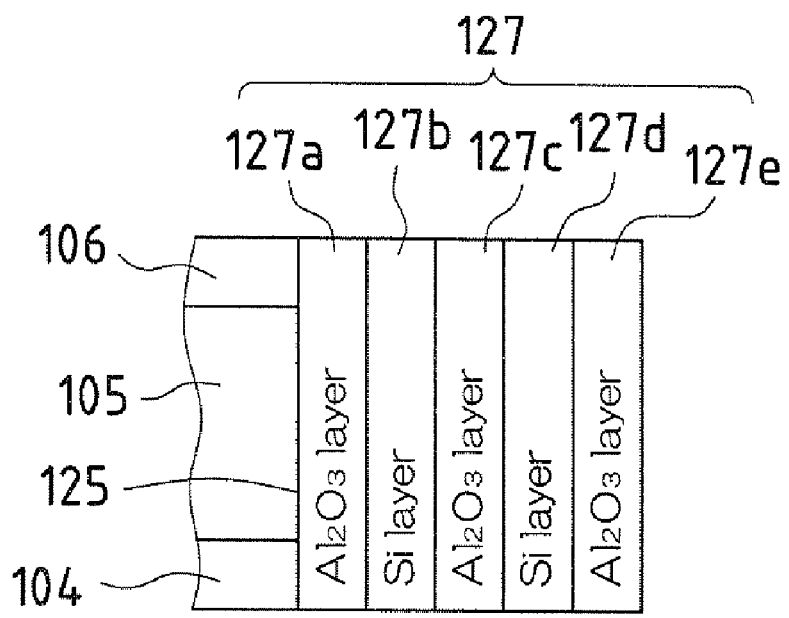
FIG. 6 is a side view that conceptually shows an example layer structure of a rear face reflection film the semiconductor laser shown in FIG. 1.

FIG. 6 is a side view that conceptually shows an example layer structure of a rear face reflection film the semiconductor laser shown in FIG. 1.

A rear face reflective film 127 is formed by layering an $Al_2O_3$ layer 127a, an Si layer 127b, an $Al_2O_3$ layer 127c, an Si layer 127d, and an $Al_2O_3$ layer 127e on the light-exiting end face 125, in this order. The rear face reflective film 127 has a reflection ratio of 90%.

A front face reflective film 126 is formed by layering an $Al_2O_3$ layer on the light-exiting end face 124, and has a reflection ratio of 8%.

Figure 7:
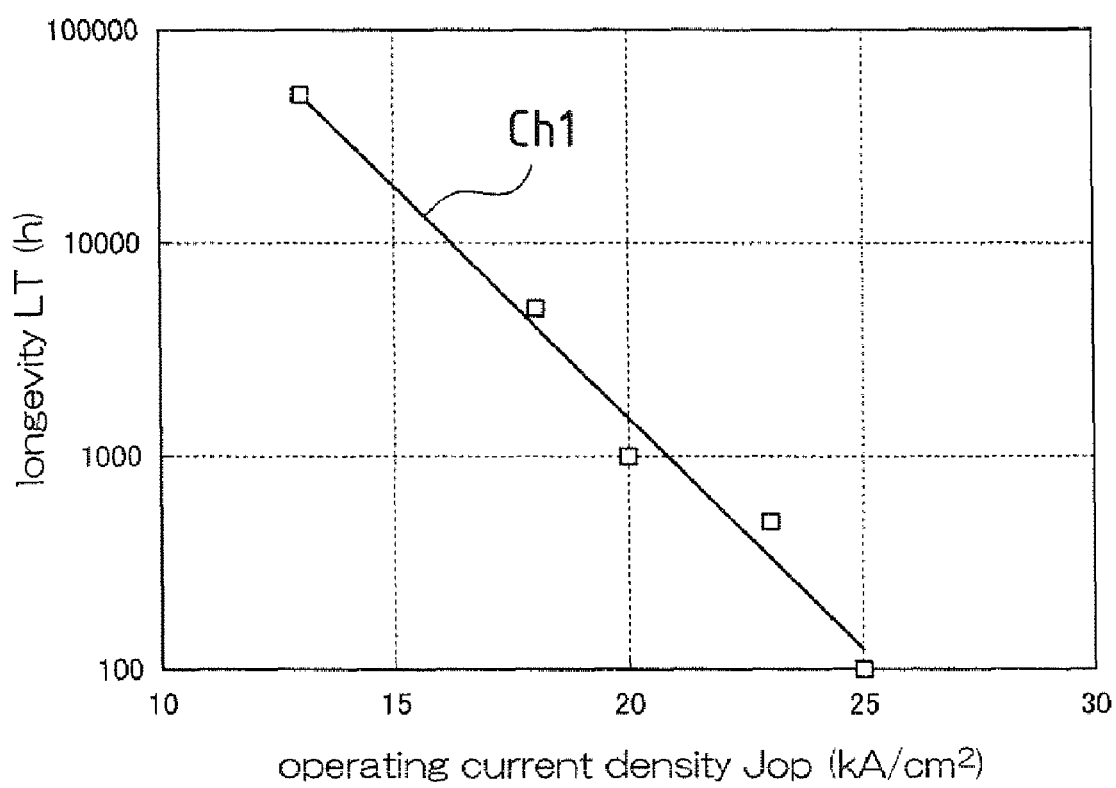
FIG. 7 is a correlation graph that shows the correlation between operating current density and longevity in the semiconductor laser shown in FIG. 1.

As shown in FIG. 7, when a window structure is formed in the semiconductor laser to establish a state in which deterioration does not occur at an end face, it is known that the longevity of the semiconductor laser is determined by the operating current density.

FIG. 7 is a correlation graph that shows the correlation between operating current density and longevity in the semiconductor laser shown in FIG. 1.

In FIG. 7, operating current density Jop($kA/cm^2$) is shown on the horizontal axis, and longevity LT(h) is shown on the vertical axis. The points indicated in the graph by squares are actually measured empirical values, and line Ch1 extracted from the actually measured empirical values indicates a correlation property of longevity to the operating current density. The longevity LT sought in practical use is 5000 hours, and it is understood from line Ch1 that an operating current density Jop of not more than $18 kA/cm^2$ is necessary in order to insure longevity LT=5000 h.

FIG. 8 is a properties comparison table that shows a comparison of configurations and properties of examples of Embodiment 1 and comparison examples, based on the semiconductor laser shown in FIG. 1.

In the semiconductor laser according to Example 1, the resonator length L=1500 μm. Also, a dopant concentration (concentration of Si used as an n-type impurity; same below) Nc of the first lower cladding layer 103 is $4.0 \times 10^{17}/cm^3$, and the dopant concentration Nc of the second lower cladding layer 104 is $4.0 \times 10^{17}/cm^3$; that is, the dopant concentration Nc of the lower cladding layer is $4.0 \times 10^{17}/cm^3$.

In the semiconductor laser according to Example 2, the resonator length L=1800 μm, which is longer than the resonator length L in Example 1. Also, the dopant concentration Nc of the first lower cladding layer 103 is $2.0 \times 10^{17}/cm^3$, and the dopant concentration Nc of the second lower cladding layer 104 is $2.0 \times 10^{17}/cm^3$; that is, the dopant concentration Nc of the lower cladding layer is $2.0 \times 10^7/cm^3$, which is less than in Embodiment 1.

In the semiconductor laser according to Comparison Example 1, the resonator length L=1300 μm, and the dopant concentration Nc of the lower cladding layer is $2.0 \times 10^{18}/cm^3$.

Further, in the semiconductor laser according to Comparison Example 2, the resonator length L=2000 μm, and the dopant concentration Nc of the lower cladding layer is $2.0 \times 10^{18}/cm^3$.

In the initial properties of the semiconductor laser according to Comparison Example 1, a threshold current Ith is 73 mA, the differential efficiency η is 0.83 W/A, and a light output (pulse in ordinary use; same below) Pop is 180 mW (75° C.). When aging was performed with light output Pop=180 mW at a temperature of 75° C., which is the temperature in actual usage conditions, the longevity LT was 5000 h (hours). An operating current Iop at that time was 420 mA. When the operating current density Jop is obtained by dividing the operating current Iop (420 mA) by the product of resonator length L=1300 μm and ridge width Wr=1.8 μm, the operating current density Jop is $18 kA/cm^2$.

Assuming that the semiconductor laser according to Comparison Example 1 is applied in an optical drive that writes at high speed, the light output Pop was further increased, being set to 300 mW. In order for light output Pop=300 mW to be output at a temperature of 75° C., an operating current Iop of 630 mA was necessary, and in this state the operating current density Jop was $27 kA/cm^2$. Under these operating conditions the longevity LT was short, at not more than 50 hours, a value at which practical use is not possible.

That is, the semiconductor laser according to Comparison Example 1 has adequate reliability at light output Pop=180 mW, but at light output Pop=300 mW, the longevity LT is short at 50 hours or less, and practical use is difficult because of inadequate reliability. That is, the operating current density Jop was $27 kA/cm^2$ when the semiconductor laser according to Comparison Example 1 was operated at light output Pop=300 mW, and it is understood that longevity is much shorter than for operating current density Jop=$18 kA/cm^2$, which is the operating current density Jop that can insure longevity LT=5000 h.

In the semiconductor laser according to Comparison Example 2, in order to lower the operating current density Jop when an operating state of light output Pop=300 mW (75° C.) is established, the resonator length L is set to 2000 μm, which is longer than in Comparison Example 1.

In the initial properties of the semiconductor laser according to Comparison Example 2, the threshold current Ith is 95 mA, and the differential efficiency η is 0.65 W/A. Because the resonator length L is increased, the differential efficiency η is very much reduced to 0.65 W/A. That is, because the resonator length L is longer than in Comparison Example 1, surface area is larger, and so there is a reduction in the operating current density Jop, but the differential efficiency η is reduced. Because the differential efficiency η is reduced, it is necessary to increase the operating current Iop in order to obtain the same light output Pop.

Accordingly, with light output Pop=300 mW, operating current Iop=800 mA is necessary, so the operating current density Jop increased to $22 kA/cm^2$, and the reliability (longevity) was reduced so that longevity LT was about 800 hours. That is, in the semiconductor laser according to Comparison Example 2, in which simply the resonator length L is increased, it is not possible to reduce the operating current density Jop to a level that adequate reliability can be obtained, and so same as in the case of Comparison Example 1, the semiconductor laser according to Comparison Example 2 is not compatible with practical use.

In the initial properties of the semiconductor laser according to Example 1, the threshold current Ith is 63 mA, the differential efficiency η is 1.05 W/A, and the operating current Iop is 500 mA with the light output Pop=300 mW (75° C.). Also, the operating current density Jop is $18 kA/cm^2$ with the light output Pop=300 mW. Accordingly, with long-term aging it is possible to insure a longevity LT of 5000 hours, and there is adequate reliability even when the light output Pop=300 mW.

That is, by increasing the resonator length L to 1500 μm, and reducing the dopant concentration Nc of the lower cladding layer to $4.0 \times 10^{17}/cm^3$, it is possible to increase the longevity LT even in a state of adequate light output Pop, and so it is possible to insure adequate reliability in practical use.

In the initial properties of the semiconductor laser according to Example 2, the threshold current Ith is 62 mA, the differential efficiency η is 1.15 W/A, and the operating current Iop is 600 mA with the light output Pop=400 mW (75° C.). Also, the operating current density Jop is 18 kA/cm² with the light output Pop=400 mW. Accordingly, same as in Embodiment 1, with long-term aging it is possible to insure a longevity LT of 5000 hours, and there is adequate reliability even when the light output Pop=400 mW, which is higher output than in Example 1. In other words, it is possible to have higher output under the same reliability conditions as in Example 1.

As described above, with the configuration of the semiconductor lasers according to Examples 1 and 2, by suppressing a reduction in the differential efficiency η that accompanies an increase in the resonator length L, an increase in the operating current density Jop is suppressed, and thus it is possible to insure a longevity LT of 5000 hours, so a semiconductor laser can be provided that has adequate reliability.

Figure 10:
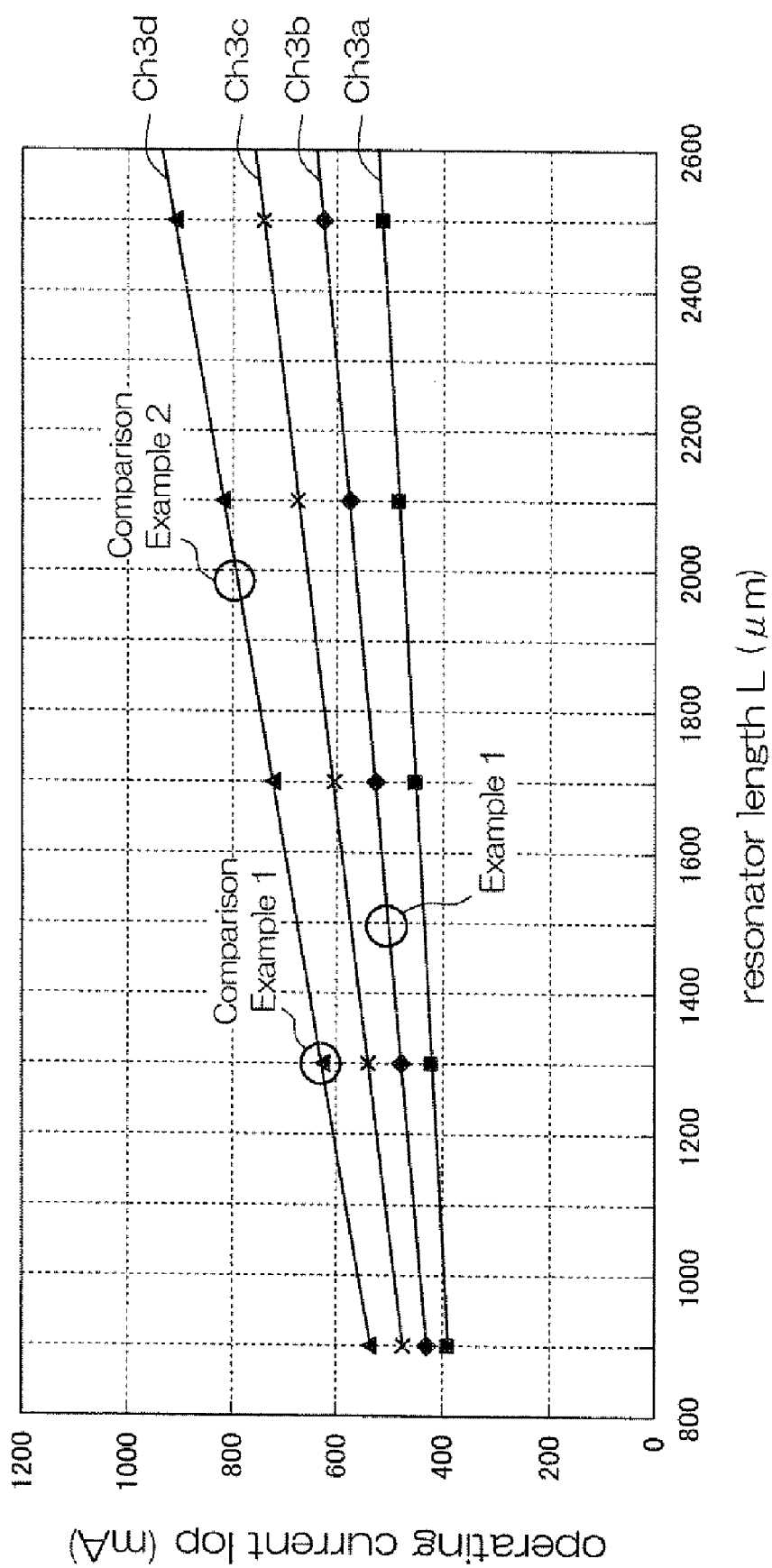
FIG. 10 is a correlation graph that shows the correlation between resonator length and operating current in the semiconductor laser shown in FIG. 1, with respect to four parameters for the dopant concentration of the lower cladding layer.
Figure 11:
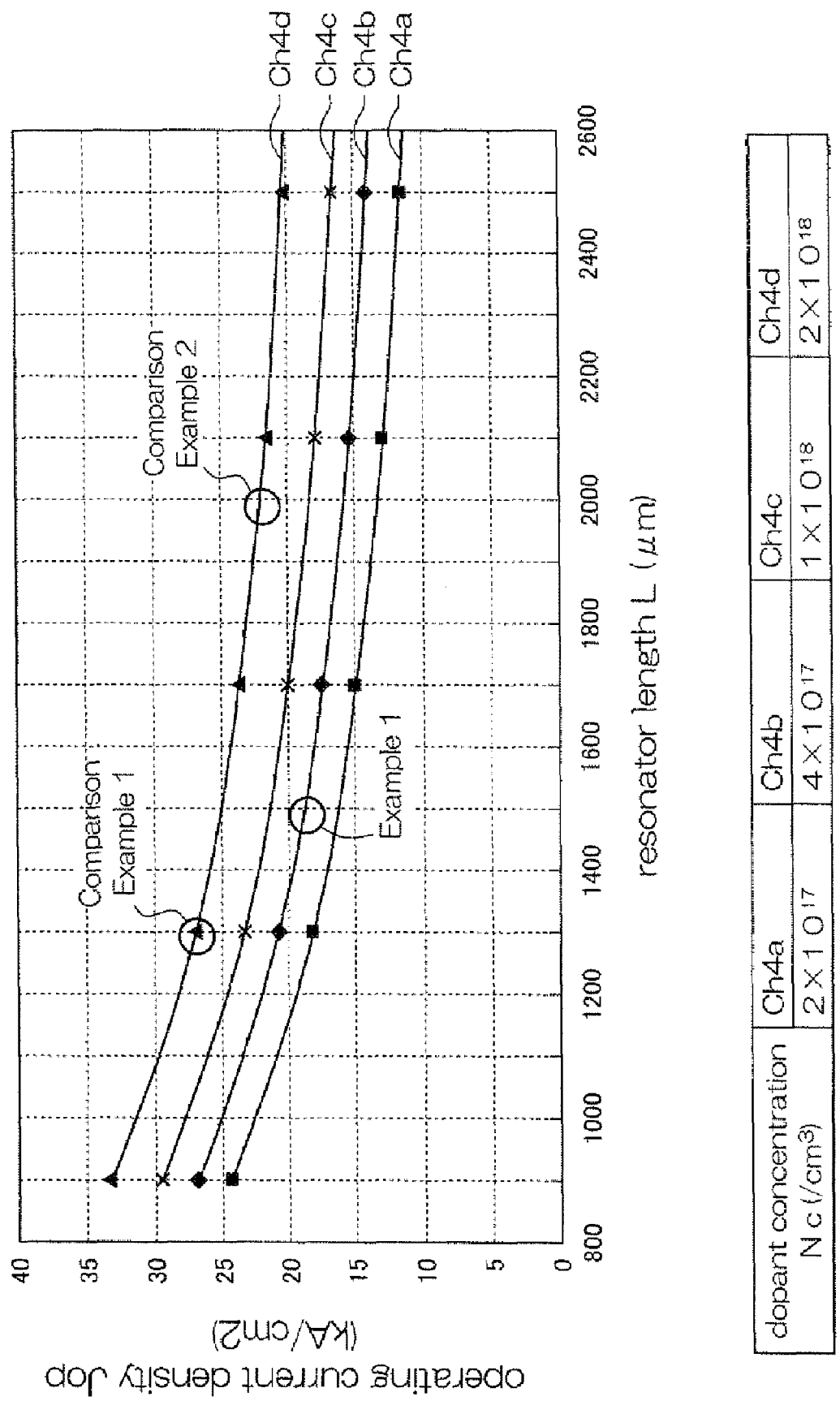
FIG. 11 is a correlation graph that shows the correlation between resonator length and operating current density in the semiconductor laser shown in FIG. 1, with respect to four parameters for the dopant concentration of the lower cladding layer.

Following is a description of the results of, based on the findings of Examples 1 and 2 and Comparison Examples 1 and 2, further collecting data, and analyzing the interrelationships of the resonator length L, the dopant concentration Nc of the lower cladding layer 103, the differential efficiency η, the operating current Iop (light output Pop=300 mW at a temperature of 75° C.), and the operating current density Jop, with reference to FIGS. 9 to 11. FIGS. 9 to 11 show characteristic curves obtained from calculated values that were calculated based on empirical values at appropriate points.

FIG. 9 is a correlation graph that shows the correlation between resonator length and differential efficiency in the semiconductor laser shown in FIG. 1, with respect to four parameters for the dopant concentration of the lower cladding layer.

In FIG. 9, resonator length L (μm) is shown on the horizontal axis, and differential efficiency η (W/A) at a temperature of 25° C. is shown on the vertical axis. Four types of dopant concentration Nc (/cm³) are used as parameters.

More specifically, a curve Ch2a shows the correlation between the resonator length L and the differential efficiency η for a case in which an Si concentration serving as the dopant concentration Nc of the lower cladding layer (the first lower cladding layer 103 and the second lower cladding layer 104) (same below) is $2.0 \times 10^{17}/cm^3$ (pertaining to Example 2), a curve Ch2b shows the correlation between the resonator length L and the differential efficiency η for a case in which the Si concentration is $4 \times 10^{17}/cm^3$ (pertaining to Example 1), a curve Ch2c shows the correlation between the resonator length L and the differential efficiency η for a case in which the Si concentration is $1 \times 10^{18}/cm^3$ (corresponding to the middle dopant concentration in Example 1 and Comparison Examples 1 and 2), and a curve Ch2d shows the correlation between the resonator length L and the differential efficiency η for a case in which the Si concentration is $2 \times 10^{18}/cm^3$ (pertaining to Comparison Examples 1 and 2).

As described above, when the resonator length L is increased, the differential efficiency η is reduced. Also, the differential efficiency η increases as the Si concentration of the lower cladding layer set as a parameter is less, so it is possible to compensate for a reduction in the differential efficiency η property due to increasing the resonator length L.

Also, when the Si concentration is small, the reduction (extent of the reduction) in the differential efficiency η is small even if the resonator length L is greatly increased. The reason for this is that due to reducing the dopant concentration Nc of the lower cladding layer, light absorption inside the semiconductor laser is lessened, and the differential efficiency η is elevated.

Each of the corresponding cases of Example 1, Comparison Example 1, and Comparison Example 2 are shown in the drawings. In consideration of these cases, by setting the resonator length L to not less than 1500 μm, and setting the dopant concentration Nc to not more than $4 \times 10^{17}/cm^3$, a reduction in the differential efficiency η is prevented, and thus it is possible to realize an adequately large differential efficiency η.

With this configuration, the reduction in the differential efficiency in the case of increased resonator length L is suppressed, and due to reducing the operating current density Jop when a desired light output Pop has been set, it is possible to insure the longevity LT that is necessary in practical use.

Also, by setting the resonator length L to not less than 1800 μm, and setting the dopant concentration Nc to not more than $2 \times 10^{17}/cm^3$, it is possible to further improve the differential efficiency η in comparison to Example 1. Accordingly, with this configuration, the operating current density Jop when a light output Pop for a still higher output than in Example 1 has been set is further reduced, so it is possible to insure the longevity LT that is necessary in practical use.

FIG. 10 is a correlation graph that shows the correlation between resonator length and operating current in the semiconductor laser shown in FIG. 1, with respect to four parameters for the dopant concentration of the lower cladding layer.

In FIG. 10, resonator length L (μm) is shown on the horizontal axis, and operating current Iop (mA) in a state of light output Pop=300 mW at a temperature of 75° C. is shown on the vertical axis. The same four types of dopant concentration Nc (/cm³) shown in FIG. 9 are used as parameters.

More specifically, a curve Ch3a shows the correlation between the resonator length L and the driving current Iop for a case in which the Si concentration is $2 \times 10^{17}/cm^3$ (pertaining to Example 2), a curve Ch3b shows the correlation between the resonator length L and the driving current Iop for a case in which the Si concentration is $4 \times 10^{17}/cm^3$ (pertaining to Example 1), a curve Ch3c shows the correlation between the resonator length L and the driving current Iop for a case in which the Si concentration is $1 \times 10^{18}/cm^3$ (corresponding to the middle dopant concentration in Example 1 and Comparison Examples 1 and 2), and a curve Ch3d shows the correlation between the resonator length L and the driving current Iop for a case in which the Si concentration is $2 \times 10^{18}/cm^3$ (pertaining to Comparison Examples 1 and 2).

As in FIG. 9, each of the corresponding cases of Example 1, Comparison Example 1, and Comparison Example 2 are shown in FIG. 10.

As described above, when the resonator length L is increased, the driving current Iop is gradually increased. Also, the driving current Iop decreases as the Si concentration of the lower cladding layer set as a parameter is less, so it is possible to compensate for an increase in the driving current Iop due to increasing the resonator length L.

Also, even when the Si concentration is reduced, when the resonator length L is set to not less than 2500 μm, because the driving current Iop exceeds 600 mA, the maximum rated current of an optical driver (laser driver IC) may sometimes be exceeded, and so there may be instances of incompatibility with practical use (curves Ch3a and Ch3b). That is, the upper limit of the resonator length L according to the semiconductor laser of the present embodiment is prescribed by the maximum rated current of the optical driver (laser driver IC).

FIG. 11 is a correlation graph that shows the correlation between resonator length and operating current density in the semiconductor laser shown in FIG. 1, with respect to four parameters for the dopant concentration of the lower cladding layer.

In FIG. 11, resonator length L (μm) is shown on the horizontal axis, and operating current density Jop (kA/cm$^2$) in a state of light output Pop=300 mW at a temperature of 75° C. is shown on the vertical axis. The operating current density Jop is obtained by dividing the operating current Iop shown in FIG. 10 by the area where the operating current Iop flows (resonator length L×ridge width Wr. Also, as in FIG. 10, the same four types of dopant concentration Nc (/cm$^3$) shown in FIG. 9 are used as parameters.

More specifically, a curve Ch4a shows the correlation between the resonator length L and the operating current density Jop for a case in which the Si concentration is $2\times10^{17}$/cm$^3$ (pertaining to Example 2), a curve Ch4b shows the correlation between the resonator length L and the operating current density Jop for a case in which the Si concentration is $4\times10^{17}$/cm$^3$ (pertaining to Example 1), a curve Ch4c shows the correlation between the resonator length L and the operating current density Jop for a case in which the Si concentration is $1\times10^{18}$/cm$^3$ (corresponding to the middle dopant concentration in Example 1 and Comparison Examples 1 and 2), and a curve Ch4d shows the correlation between the resonator length L and the operating current density Jop for a case in which the Si concentration is $2\times10^{18}$/cm$^3$ (pertaining to Comparison Examples 1 and 2).

As in FIGS. 9 and 10, each of the corresponding cases of Example 1, Comparison Example 1, and Comparison Example 2 are shown in FIG. 11.

In order to insure the reliability necessary for practical use (longevity LT=5000 h), as shown in FIG. 7, an operating current density Jop of not less than 18 kA/cm$^2$ is necessary, but as shown in FIG. 11, by simply increasing the resonator length L in a state with a high concentration of the dopant concentration Nc maintained for the lower cladding layer as in Comparative Examples 1 and 2, because the increase in the resonator length L is accompanied by a decrease in the differential efficiency η (FIG. 9), it is difficult to set the operating current density Jop to not more than 18 kA/cm$^2$ (curves Ch4c and Ch4d).

On the other hand, as described above, by reducing the dopant concentration Nc of the lower cladding layer, light absorption inside the semiconductor laser is reduced and thus the differential efficiency η can be increased, so in order to reduce the operating current density Jop, it is necessary to introduce, simultaneously and with good balance, both an increase in the resonator length L and a reduction in the dopant concentration Nc of the lower cladding layer (curves Ch4a and Ch4b).

For example, in the case of Example 2, because the light output Pop is improved about 30% (light output Pop=400 mW) relative to curve Ch4a, the operating current Iop is increased about 20%, and in this case as well, it is clear from curve Ch4a (resonator length L=1800 μm and operating current density is about 15 kA/cm$^2$) that the operating current density Jop can be set to not more than 18 kA/cm$^2$.

As described above, due to the configuration and properties (FIGS. 8 to 11) of the semiconductor laser of Example 1, when the resonator length L has been set to not less than 1500 μm, by setting the dopant concentration Nc of the lower cladding layer to not more than $4.0\times10^{17}$/cm$^3$, a reduction in the differential efficiency η due to an increase in the resonator length L is prevented, thus realizing an adequate differential efficiency η, and reducing the operating current density Jop when a desired light output Pop has been output, so a semiconductor laser can be provided for which adequate reliability in practical use can be insured.

Also, as described above, due to the configuration and properties (FIGS. 8 to 11) of the semiconductor laser of Example 2, when the resonator length L has been set to not less than 1800 μm, by setting the dopant concentration Nc of the lower cladding layer to not more than $2.0\times10^{17}$/cm$^3$, a reduction in the differential efficiency η due to an increase in the resonator length L is prevented, thus realizing an adequate differential efficiency η, and reducing the operating current density Jop when a desired light output Pop that is still higher has been output, so a semiconductor laser can be provided for which adequate reliability in practical use can be insured.

Embodiment 2

In Embodiment 1, simultaneously and with good balance, both an increase in the resonator length L and a reduction in the dopant concentration Nc of the lower cladding layer were introduced, thus maintaining the operating current density Jop at not more than a predetermined value (for example, in Embodiment 1, operating current density Jop=18 kA/cm$^2$), and so the longevity LT at a desired light output Pop was improved, but on the other hand, the problem occurs that a reduction in the dopant concentration Nc of the lower cladding layer is accompanied by an increase in an element resistance Rd of the semiconductor laser. In particular, it is conceivable that when the dopant concentration of the lower cladding layer (the first lower cladding layer 103 and the second lower cladding layer 104) is reduced throughout the entire layer, the resistance of the lower cladding layer may increase, and an operating voltage Vop may rise.

The semiconductor lasers according to the present embodiment (Examples 3 to 6) differ from Example 1 (Embodiment 1) mainly in that the element resistance Rd of these semiconductor lasers is reduced. Embodiment 2 (Examples 3 to 6) will be described with reference to FIG. 12.

Figure 12:
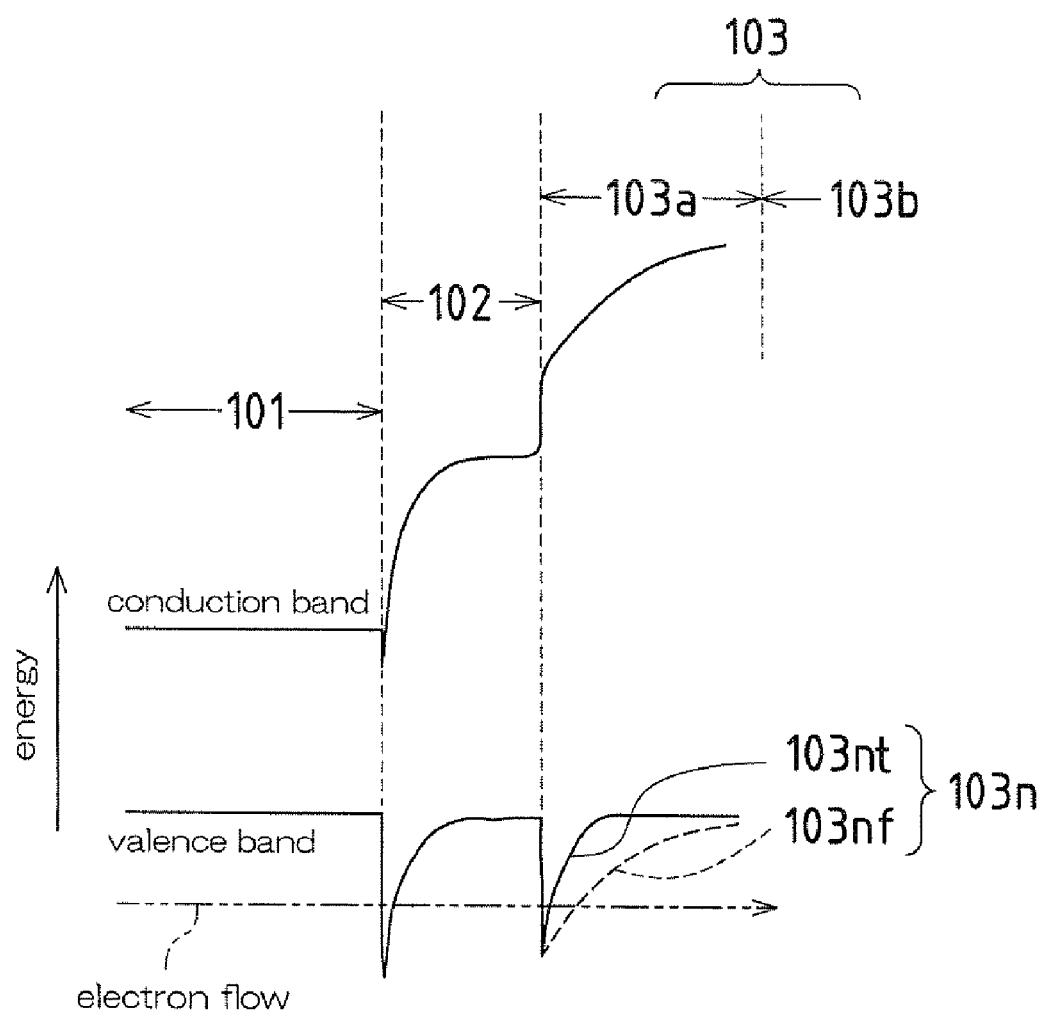
FIG. 12 is an energy band diagram that schematically shows energy bands of an example structure of a lower cladding layer of a semiconductor laser according to a non-limiting Embodiment 2.

FIG. 12 is an energy band diagram that schematically shows energy bands of an example structure of a lower cladding layer of a semiconductor laser according to Embodiment 2 of the present invention.

EXAMPLE 3

The semiconductor laser (FIG. 12) according to Example 3 is configured such that, relative to the semiconductor laser according to Example 1, the resistance of a lower cladding layer configured with a first lower cladding layer 103 and a second lower cladding layer 104 is reduced. Aspects of the configuration of the resonator length L and others (resonator length L=1500 μm, light output Pop=300 mW) are shared with Example 1, and so mainly the differing points will be described.

More specifically, in Example 3, the first lower cladding layer 103 has a two layer structure divided into a substrate-side region 103a that is located on a semiconductor substrate 100-side, and an active layer-side region 103b that is located on an active layer 105-side (second lower cladding layer 104-side).

The substrate-side region 103a has a thickness of 0.25 μm and a dopant concentration Nc of $7\times10^{17}$(/cm$^3$), and the active layer-side region 103b has a thickness of 1.75 μm and a dopant concentration Nc of $4.0\times10^{17}(/cm^3)$.

More specifically, in the semiconductor laser according to Example 3, the dopant concentration Nc in the substrate-side region 103a of the first lower cladding layer 103 is higher than the dopant concentration Nc in the active layer-side region 103b located on the active layer 105-side of the first lower cladding layer 103 (dopant concentration Nc of the lower cladding layer).

In both the semiconductor laser according to Embodiment 1 and the semiconductor laser according to the present non-limiting embodiment, a notch 103n (Example 1: notch 103nf, Example 3: notch 103nt; referred to as notch 103n when it is not necessary to distinguish between the notch 103nf and the notch 103nt) occurs that is caused by band incontinuity that occurs at a border portion from the buffer layer 102 to the first lower cladding layer 103 (substrate-side region 103a).

As for the notch 103nf in Example 1, because the dopant concentration Nc of the lower cladding layer (the first lower cladding layer 103 and the second lower cladding layer 104) is reduced (Nc=$4.0\times10^{17}(/cm^3)$), the notch 103nf is larger than in Comparison Examples 1 and 2, and so the flow of electrons from the buffer layer 102 to the first lower cladding layer 103 is impaired. As a result, the element resistance Rd is increased, and as a result a large operating voltage Vop is necessary.

On the other hand, with respect to the notch 103nt in Example 3, the second lower cladding layer 104 is the same as in Example 1, and the first lower cladding layer 103 has a two layer structure in which the dopant concentration is Nc=$7\times10^{17}$ (/cm$^3$) in the semiconductor-side region 103a of the semiconductor substrate 100-side. Because the dopant concentration is higher than in the case of Example 1(Nc=$4.0\times10^{17}(/cm^3)$), it is possible to make the notch 103nt smaller than the notch 103nf.

Accordingly, it is possible to reduce the cause of impairing the flow of electrons from the buffer layer 102 to the first lower cladding layer 103 (the semiconductor-side region 103a) in comparison to Example 1, and as a result it is possible to reduce the element resistance Rd. That is, in the semiconductor laser according to Example 3, it is possible to reduce the element resistance Rd, so an increase in the operating voltage Vop can be prevented.

As described above, the first lower cladding layer 103 has a two layer structure that includes the substrate-side region 103a and the active layer-side region 103b, and by setting the dopant concentration Nc in the substrate-side region 103a higher than the dopant concentration Nc in the active layer-side region 103b (dopant concentration Nc of the lower cladding layer), it is possible to realize a semiconductor laser having a high differential efficiency η in which an increase in the operating voltage Vop is prevented.

EXAMPLE 4

That is, in the semiconductor laser according to Example 4 (basic configuration is shared with Example 3 shown in FIG. 12, and so those reference numerals are cited as necessary), the configuration of Example 3 is prescribed from the relationship with light distribution inside the semiconductor laser. In other words, inside the semiconductor lasers according to Examples 1 and 3, nearly all light is distributed to the active layer-side region 103b, due to the convergence properties of the semiconductor laser. Accordingly, the influence of light absorption in Example 3 is the same as in Example 1, and there is the same value for the differential efficiency η as in Example 1.

The semiconductor laser according to Example 4, same as the semiconductor laser according to Example 3, has a two layer structure, and is configured so that the two layer structure matches the distribution state of light that has been waveguided with the active layer 105. Other aspects of the configuration are the same as in Example 3, and so mainly the differing points will be described.

More specifically the first lower cladding layer 103 is provided with a substrate-side region 103a located on the semiconductor substrate 100-side and where light that is waveguided with the active layer 105 is not distributed, and an active layer-side region 103b located on the active layer 105-side and where light that is waveguided with the active layer 105 is distributed. The dopant concentration Nc is higher in the substrate-side region 103a than in the active layer-side region 103b.

With this configuration, same as with the semiconductor laser according to Example 3, it is possible to reduce the element resistance Rd, and therefore it is possible to realize a semiconductor laser having a high differential efficiency η in which there is no increase in the operating voltage Vop.

EXAMPLE 5

In the semiconductor laser according to Example 5 (basic configuration is shared with Example 3 shown in FIG. 12, and so those reference numerals are cited as necessary), the dopant concentration Nc has been gradually increased from the active layer-side region 103b to the substrate-side region 103a. In Examples 3 and 4, the first lower cladding layer had a two layer structure, but the same working effect is obtained when a two layer structure is not adopted, and the dopant concentration Nc in the substrate-side region 103a is gradually changed. Other aspects of the configuration are the same as in Examples 3 and 4, and so mainly the differing points will be described.

More specifically, a lower cladding layer is configured with a first lower cladding layer 103 on a semiconductor substrate 100-side and a second lower cladding layer 104 on an active layer-side. The first lower cladding layer 103 is provided with a substrate-side region 103a located on the semiconductor substrate 100-side and where light that is waveguided with the active layer 105 is not distributed, and an active layer-side region 103b located on the active layer 105-side and where light that is waveguided with the active layer 105 is distributed. The dopant concentration Nc in the substrate-side region 103a is gradually increased relative to the dopant concentration Nc in the active layer-side region 103b, beginning from the active layer 105-side. In this case, the dopant concentration Nc can be the same as in Examples 3 and 4.

With this configuration, same as with the semiconductor laser according to Examples 3 and 4, it is possible to realize a semiconductor laser having a high differential efficiency η in which there is no increase in the operating voltage Vop.

EXAMPLE 6

When the thickness of a substrate-side region 103a with a greater dopant concentration Nc than the dopant concentration Nc in the active layer-side region 103b is too thick, the differential efficiency η falls, and when the thickness is too thin, there is less of an effect of reducing the element resistance Rd.

In the semiconductor laser according to Example 6, the thickness of the substrate-side region 103a is optimized, and this semiconductor laser is applicable to any of the other examples. That is, in the present embodiment, the thickness of the notch 103n is about 30 nm to 90 nm, so it is preferable that the range of thickness of the substrate-side region 103a is set to not less than 30 nm and not more than 100 nm. Also, in consideration of the dispersion of dopant from the substrate-side region 103a to the active layer-side region 103b, it is preferable that the range of thickness of the substrate-side region 103a is set to not less than 30 nm and not more than 300 nm.

With this configuration, it is possible to reliably realize a semiconductor laser having a high differential efficiency η in which there is no increase in the operating voltage Vop, in which driving with a low operating voltage is possible.

Embodiment 3

In the present non-limiting embodiment, Examples 7 and 8 are described as cases in which, to further increase write speed to an optical driver, the optical output Pop of the semiconductor laser is further increased in comparison to Example 1 (light output Pop=300 mW) of Embodiment 1 and Embodiment 2 (Examples 3 to 6), so that same as in Example 2 of Embodiment 1, the optical output Pop is set to 400 mW. Also, the basic configuration of the semiconductor laser according to the present embodiment is shared with Example 3 shown in FIG. 12, and so those reference numerals are cited as necessary.

In the semiconductor laser according to Examples 7 and 8, in contrast to the semiconductor laser according to Embodiment 2, same as in the case of Embodiment 2 (Examples 3 and 4), the first lower cladding layer 103 has a two layer structure divided into a substrate-side region 103a that is located on a semiconductor substrate 100-side, and an active layer-side region 103b that is located on an active layer 105-side (second lower cladding layer 104-side). Also, a structure can be adopted in which, same as in Example 5, the concentration is gradually changed.

That is, in the semiconductor lasers according to Examples 7 and 8, Embodiment 2 is applied to the semiconductor laser according to Example 2, and these semiconductor lasers are configured with reduced resistance of the lower cladding layer configured with the first lower cladding layer 103 and the second lower cladding layer 104. Aspects of the configuration of the resonator length L and others are shared with Example 2 (resonator length L=1800 μm, light output Pop=400 mW) and so mainly the differing points will be described.

Specifically, in Example 7, the substrate-side region 103a has a thickness of 0.25 μm and a dopant concentration Nc of $5 \times 10^{17}$(/cm$^3$), and the active layer-side region 103b has a thickness of 1.75 μm and a dopant concentration Nc of $2 \times 10^{17}$(/cm$^3$). Also, in Example 8, the substrate-side region 103a has a thickness of 0.25 μm and a dopant concentration Nc of $10 \times 10^{17}$(/cm$^3$), and the active layer-side region 103b has a thickness of 1.75 μm and a dopant concentration Nc of $2 \times 10^{17}$(/cm$^3$).

Figure 13:
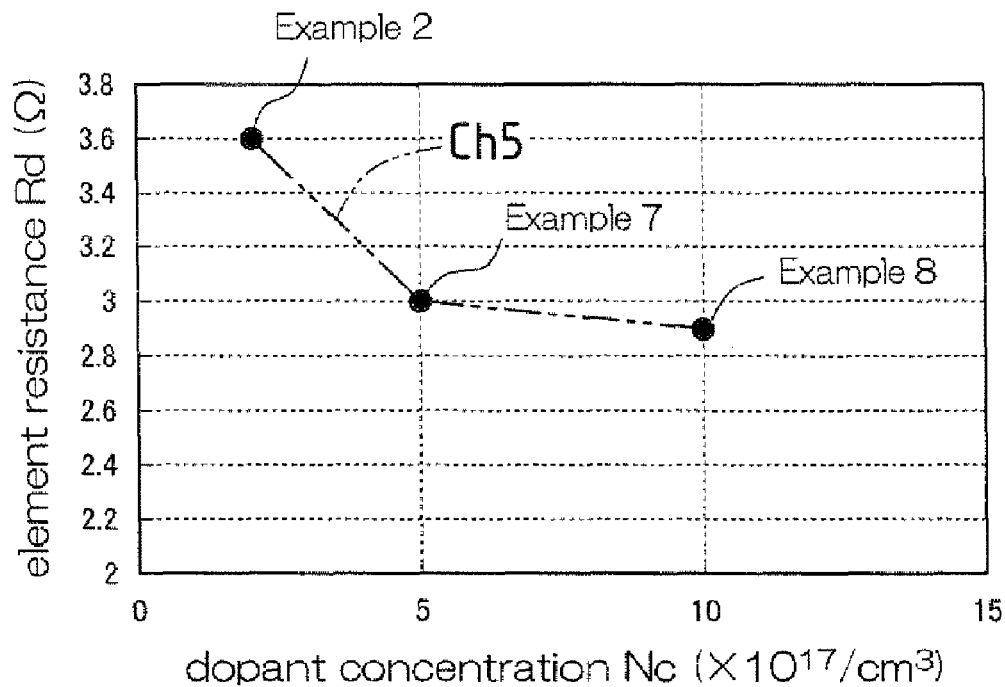
FIG. 13 is a correlation graph that shows the correlation between dopant concentration in a substrate-side region and element resistance in a semiconductor laser according to Embodiment 3 of the present invention.
Figure 14:
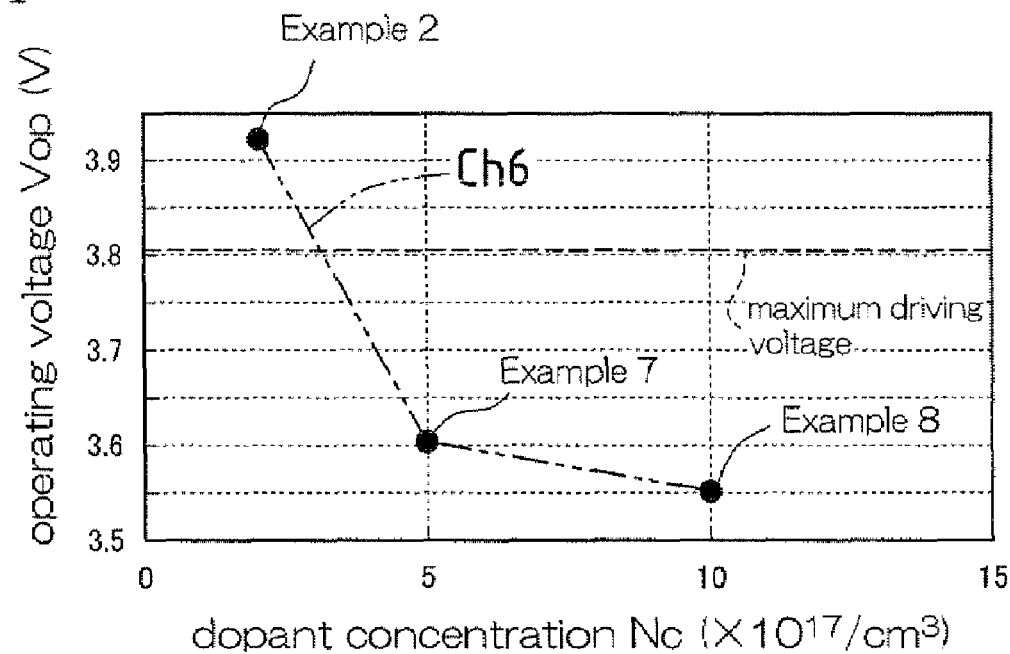
FIG. 14 is a correlation graph that shows the correlation between dopant concentration in a substrate-side region and operating voltage in the semiconductor laser according to Embodiment 3 of the present invention.

FIG. 13 is a correlation graph that shows the correlation between dopant concentration in the substrate-side region and element resistance in the semiconductor laser according to a non-limiting Embodiment 3, and FIG. 14 is a correlation graph that shows the correlation between dopant concentration in the substrate-side region and operating voltage in the semiconductor laser according to Embodiment 3.

In FIG. 13, the dopant concentration Nc ($\times 10^{17}$(/cm$^3$)) in the substrate-side region 103a is shown on the horizontal axis, and the element resistance Rd (Ω) is shown on the vertical axis. Also, in FIG. 14, same as in FIG. 13, the operating voltage Vop (light output Pop=400 mW at a temperature of 75° C.) is shown on the vertical axis.

In FIGS. 13 and 14, in the case of Example 7, (dopant concentration Nc in the substrate-side region 103a is $5 \times 10^{17}$ (/cm$^3$)), the element resistance Rd is 3(Ω), and the operating voltage Vop is 3.6(V). On the other hand, in the case of dopant concentration Nc=$2 \times 10^{17}$(/cm$^3$) corresponding to Example 2, the element resistance Rd is 3.6(Ω), and the operating voltage Vop is 3.92(V). Also, in the case of Example 8, (dopant concentration Nc in the substrate-side region 103a is $10 \times 10^{17}$(/cm$^3$)), the element resistance Rd is 2.85(Ω), and the operating voltage Vop is 3.55(V). That is, the correlation between the dopant concentration Nc in the substrate-side region 103a and the element resistance Rd is indicated by curve Ch5, and the correlation between the dopant concentration Nc in the substrate-side region 103a and the operating voltage Vop is indicated by curve Ch6.

It is necessary that the operating voltage Vop of the semiconductor laser is not more than the maximum driving voltage (maximum rated output) of the laser driver IC that drives the semiconductor laser with current. That is, current cannot be applied to a semiconductor laser that requires an operating current greater than the maximum driving voltage of the laser driver IC, and so the laser driver IC cannot be applied.

5V is the most common power source voltage of an optical pickup (laser driver IC). In the case of power source voltage 5V, the range of the power source rating is 5±0.5V, so the minimum allowable power source voltage is 4.5V. Also, it is necessary that a voltage drop of the laser driver IC itself is 0.7V, so the maximum driving voltage allowable for the semiconductor laser is 4.5V−0.7V=3.8V.

Accordingly, in order to output a high light output Pop (for example, light output Pop=400 mW), it is necessary to set the dopant concentration to not less than Nc=$3 \times 10^{17}$(/cm$^3$), that being a dopant concentration at which it is possible to reduce the element resistance Rd, and possible to set the operating voltage Vop to not more than the maximum driving voltage (3.8V) of the laser driver IC. Also, in order to further guarantee certainty and reliability, it is preferable that the dopant concentration in the substrate-side region 103a is set to not less than Nc=$4 \times 10^{17}$(/cm$^3$).

With the semiconductor laser according to the present embodiment, reliability at high light output is insured, and even when write speed to the optical driver has been further increased, a rise in the operating voltage is prevented, so driving at low driving voltage is possible, and thus driving with an ordinary laser driver IC is performed.

Embodiment 4

Figure 15:
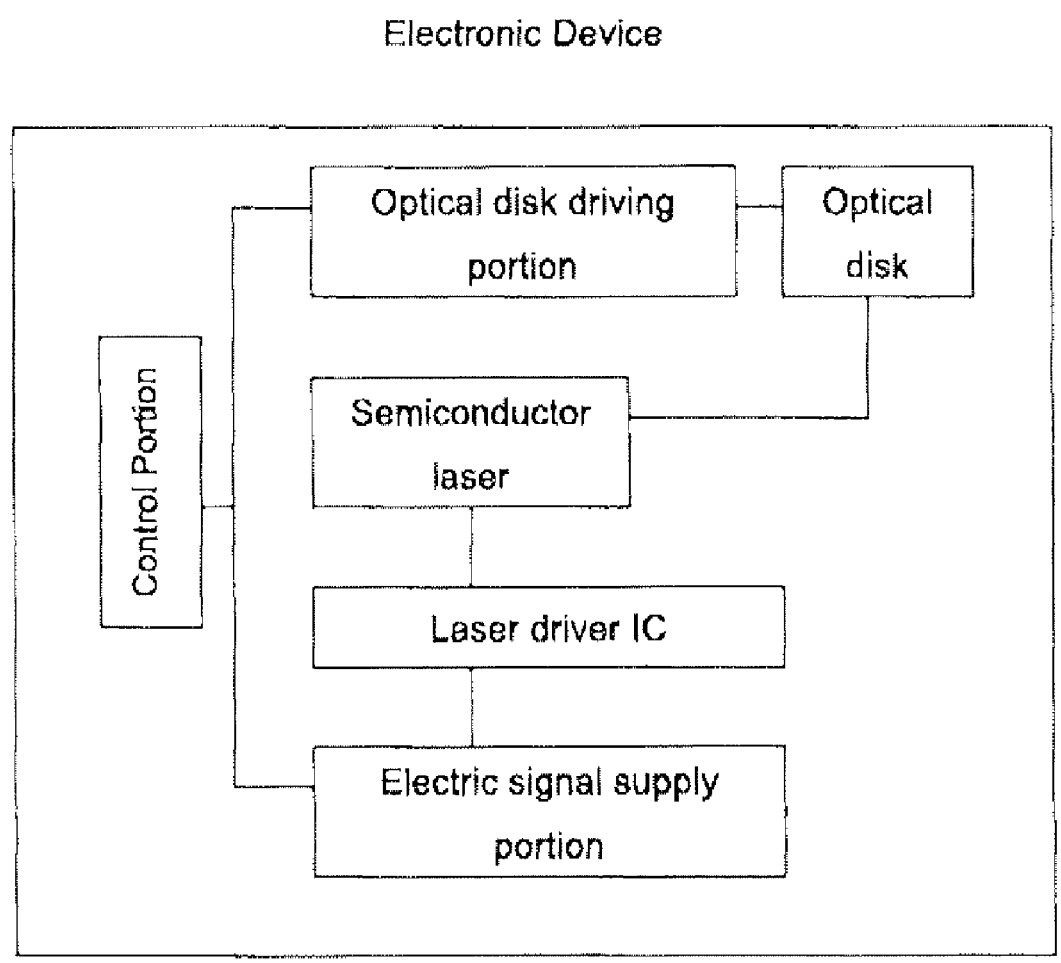
FIG. 15 illustrates an embodiment of an electronic for writing optical data using a semiconductor laser.

An electronic device (illustrated in FIG. 15) according to the present non-limiting embodiment is configured to write optical data to an optical disk (optical disk for writing) using a semiconductor laser. The electronic device according to the present embodiment has a configuration in which a semiconductor laser according to Embodiments 1 to 3 is applied.

The electronic device is provided with an optical disk driving portion that rotationally drives an optical disk, a semiconductor laser that writes optical data to an optical disk that has been placed in the optical disk driving portion, a laser driver IC that drives the semiconductor laser to generate an optical signal that corresponds to an electric signal, an electric signal supply portion that supplies an electric signal that corresponds to an optical signal to the laser driver IC, and a control portion that controls the optical disk driving portion and the electric signal supply portion to allow the configuration to function as an electronic device. The control portion is configured by a central processing apparatus (CPU).

With this configuration, it is possible to provide an electronic device capable of writing optical data to an optical disk reliably over a long period of time.

The present invention may be embodied in various other forms without departing from the spirit or essential characteristics thereof. The embodiments disclosed in this application are to be considered in all respects as illustrative and not limiting. The scope of the invention is indicated by the appended claims rather than by the foregoing description, and all modifications or changes that come within the meaning and range of equivalency of the claims are intended to be embraced therein.

What is claimed is:

1. A semiconductor laser, comprising:
a first conductivity type lower cladding layer formed on a substrate;
an active layer that includes a quantum well layer formed above the lower cladding layer; and
a second conductivity type upper cladding layer formed above the active layer,
wherein a dopant concentration of the lower cladding layer is not more than $4.0\times10^{17}/cm^3$,
wherein a resonator length is not less than 1500 μm, and
wherein the lower cladding layer comprises a first lower cladding layer on the semiconductor substrate side and a second lower cladding layer on the active layer side, wherein the first lower cladding layer comprising
a substrate side region located on the semiconductor substrate side and where light that is waveguided with the active layer is not distributed, and
an active layer side region located on the active layer side and where light that is waveguided with the active layer is distributed, and
wherein the dopant concentration in the substrate side region is set higher than the dopant concentration in the active layer side region.

2. A semiconductor laser, comprising:
a first conductivity type lower cladding layer formed on a substrate;
an active layer that includes a quantum well layer formed above the lower cladding layer; and
a second conductivity type upper cladding layer formed above the active layer, wherein
a dopant concentration of the lower cladding layer is not more than $2.0\times10^{17}/cm^3$, and
a resonator length is not less than 1800 μm.

3. A semiconductor laser, comprising:
a first conductivity type lower cladding layer formed on a substrate;
an active layer that includes a quantum well layer formed above the lower cladding layer; and
a second conductivity type upper cladding layer formed above the active layer,
wherein a dopant concentration of the lower cladding layer is not more than $4.0\times10^{17}/cm^3$,
wherein a resonator length is not less than 1500 μm,
wherein the lower cladding layer comprises a first lower cladding layer on the semiconductor substrate side and a second lower cladding layer on the active layer side, and
wherein the dopant concentration in a semiconductor side region that is located on the semiconductor substrate side of the first lower cladding layer is set higher than the dopant concentration in an active layer side region that is located on the active layer side of the first lower cladding layer.

4. The semiconductor laser according to claim 2,
wherein the lower cladding layer comprises a first lower cladding layer on the semiconductor substrate side and a second lower cladding layer on the active layer side, and
wherein the dopant concentration in a semiconductor side region that is located on the semiconductor substrate side of the first lower cladding layer is set higher than the dopant concentration in an active layer side region that is located on the active layer side of the first lower cladding layer.

5. The semiconductor laser according to claim 2,
wherein the lower cladding layer comprises a first lower cladding layer on the semiconductor substrate side and a second lower cladding layer on the active layer side, the first lower cladding layer comprising
a substrate side region located on the semiconductor substrate side and where light that is waveguided with the active layer is not distributed, and
an active layer side region located on the active layer side and where light that is waveguided with the active layer is distributed, and
wherein the dopant concentration in the substrate side region is set higher than the dopant concentration in the active layer side region.

6. The semiconductor laser according to claim 1, wherein the dopant concentration in the substrate side region is gradually increased relative to the dopant concentration in the active layer side region, beginning from the active layer side.

7. The semiconductor laser according to claim 2,
wherein the lower cladding layer comprises a first lower cladding layer on the semiconductor substrate side and a second lower cladding layer on the active layer side, the first lower cladding layer comprising
a substrate-side region located on the semiconductor substrate side and where light that is waveguided with the active layer is not distributed, and
an active layer side region located on the active layer side and where light that is waveguided with the active layer is distributed, and
the dopant concentration in the substrate side region is gradually increased relative to the dopant concentration in the active layer side region, beginning from the active layer side.

8. The semiconductor laser according to claim 3, wherein the dopant concentration of the substrate side region is not less than $4.0\times10^{17}/cm^3$.

9. The semiconductor laser according to claim 3, wherein the thickness of the substrate side region is not less than 30 nm and not more than 300 nm.

10. The semiconductor laser according to claim 8, wherein the thickness of the substrate side region is not less than 30 nm and not more than 300 nm.

11. The semiconductor laser according to claim 1, wherein a light-exiting end portion of the active layer has a window structure.

12. The semiconductor laser according to claim 3, wherein a light-exiting end portion of the active layer has a window structure.

13. The semiconductor laser according to claim 1, wherein the dopant of the lower cladding layer is silicon.

14. The semiconductor laser according to claim 3, wherein the dopant of the lower cladding layer is silicon.

15. An electronic device that writes optical data, comprising:
 a semiconductor laser according to claim 1; and
 a laser driver IC arranged to drive the semiconductor laser.

16. An electronic device that writes optical data, comprising:
 a semiconductor laser according to claim 3; and
 a laser driver IC arranged to drive the semiconductor laser.

17. An electronic device that writes optical data, comprising:
 a semiconductor laser according to claim 2; and
 a laser driver IC arranged to drive the semiconductor laser.

18. The semiconductor laser according to claim 1, wherein the dopant concentration of the substrate side region is not less than $4.0 \times 10^{17}/cm^3$.

19. The semiconductor laser according to claim 1, wherein the thickness of the substrate side region is not less than 30 nm and not more than 300 nm.

20. The semiconductor laser according to claim 18, wherein the thickness of the substrate side region is not less than 30 nm and not more than 300 nm.

* * * * *